United States Patent [19]
Holzwarth

[11] Patent Number: 5,517,105
[45] Date of Patent: May 14, 1996

[54] DUAL LINKED ZOOM BOXES FOR INSTRUMENT DISPLAY

[75] Inventor: Benton Holzwarth, Tigard, Oreg.

[73] Assignee: Tektronix, Inc., Wilsonville, Oreg.

[21] Appl. No.: 328,983

[22] Filed: Oct. 25, 1994

[51] Int. Cl.$^6$ .................................................. G01R 13/20
[52] U.S. Cl. ..................... 324/121 R; 345/134; 345/131
[58] Field of Search ......................... 324/121 R; 345/134, 345/131, 10

[56] References Cited

U.S. PATENT DOCUMENTS

| | | |
|---|---|---|
| 4,975,636 | 12/1990 | Desautels . |
| 5,039,937 | 8/1991 | Mandt et al. . |
| 5,129,722 | 7/1992 | Mader . |

FOREIGN PATENT DOCUMENTS

| | | |
|---|---|---|
| 4198620 | 7/1992 | Japan . |

OTHER PUBLICATIONS

Tektronix TDS 420 & TDS 460 Digitizing Oscilloscopes User Manual From Years 1992 and 1993, pp. 2–25, 3–109 to 3–111.
Textronix Product Literature Manual From Years 1992 and 1993 pp. 65 and 57.

Primary Examiner—Kenneth A. Wieder
Assistant Examiner—Kourosh Cyrus Khosravi
Attorney, Agent, or Firm—Boulden G. Griffith

[57] ABSTRACT

A digital oscilloscope of the type that processes (30) the digital waveform values of the waveform record using interpolation and/or decimation (81) to produce a main trace record (91) and first (92) and second (93) zoomed trace records, and uses those records to produce (40) a main trace display (65) and first (61) and second (62) zoomed trace displays is improved by providing (94) a first zoom box (63) encompassing that portion of the main trace (65) display shown in the first zoomed trace (61) display and a second zoom box (64) encompassing that portion of the main trace (65) display shown in the second zoomed trace (62) display. Controls for the two zoom boxes are ganged together so that they both have a horizontal-time dimension determined (85) by a relationship between horizontal-time settings of the first zoomed trace display and horizontal-time settings of the main trace display and vertical-amplitude dimensions determined (87) by a relationship between vertical-amplitude settings of the first zoomed trace display and vertical-amplitude settings of the main trace display. The horizontal-time separation between the first and second zoomed displays, and therefore the two zoom boxes, is controllable (50) by an operator and provided as a readout (66) for measurement convenience.

6 Claims, 3 Drawing Sheets dance with the present invention includes an analog to
DUAL LINKED ZOOM BOXES FOR INSTRUMENT DISPLAY

FIELD OF THE INVENTION

This invention relates to instrument displays, and more particularly to the provision of a pair of "zoom boxes" in a digital oscilloscope display, the zoom boxes enclosing and thereby identifying the portions of a main trace that are shown in a "zoom window".

BACKGROUND OF THE INVENTION

U.S. Pat. No. 4,975,636 to Desautels for a "Method and Apparatus for Selecting and Displaying a High Resolution Window from a Main Display", hereby incorporated by reference, describes an oscilloscope display with a portion of a main trace shown in a window with a different scale. The Background of the Invention of this patent provides a good explanation of why the operator of a digital oscilloscope finds it useful to be able to examine a portion of a main trace more closely using a second trace with higher resolution. To provide this feature, the '636 patent describes how a software program operates in conjunction with a single set of timebase hardware to allow the operator to concurrently select both a main trace and an second trace with a higher resolution than the main trace showing a subsection of the main trace in more detail. As is described in column 3 of this patent, data is acquired with relatively high horizontal (time) resolution that is more than is needed for a typical main display. However, this extra horizontal resolution is used to produce the second trace with higher resolution. The operator identifies the region to be examined in detail by positioning a pair of vertical cursors at the beginning and end of it on the main trace, and this portion of the main trace is then shown in more detail in the second, higher resolution trace.

U.S. Pat. No. 5,039,937 to Mandt et al. for a "Method and Apparatus for Providing Compressed and Expanded Displays on a Digital Oscilloscope", hereby incorporated by reference, describes another approach to giving a digital oscilloscope operator a detailed view of part of an acquired waveform and another view showing the relationship of that detailed view to a bigger picture of the acquired waveform. In this approach, the overview display is relatively small and is called a "scroll bar waveform". The scroll bar waveform contains a highly compressed and simplified version of the waveform data, and a pair of brackets associated with it. The location of these brackets defines the amount of the scroll bar waveform data that is shown in a larger and more detailed main display that generally has higher resolution.

U.S. Pat. No. 5,129,722 to Mader et al. for an "Expansion Windowing System for a Measurement Test Instrument", hereby incorporated by reference, describes a system for expanding a waveform that includes an expansion viewport and a cursor. The expansion viewport has a centerpoint whose location is controlled by where the horizontal cursor intersects the waveform, and has horizontal and vertical dimensions that are controlled by two knobs on the front panel. Activating an expand switch causes the display to be filled with the contents of the expansion viewport.

Japanese Laid Open Patent Application No. 4-198620 filed Jul. 24, 1992 by Yokogawa Electric Corporation for a "Waveform Analyzer" and published on Feb. 18, 1994, describes a display system having an enlargement region of a main trace identified with a box-type region. Statistical waveform analysis techniques may be applied to the whole waveform or to only that portion of it that is within the box-type region.

In prior art oscilloscopes presently built by Applicant's corporation, Tektronix, Inc., a software routine performs interpolation or decimation on acquired waveform data as required to convert it into trace data. Acquired waveform data describes the voltage levels present on an input signal at regular time intervals. This data is stored at addresses that correspond to successive acquisition times, so that there is a linear relationship between successive address numbers and successive data acquisition times (ignoring the fact that physical addresses may be in a circular memory or that data may be demultiplexed to multiple memories because of speed considerations). The successive time intervals between samples in the acquired waveform data may be too long or too short relative to the detail with which the operator wants to examine the data. For example, the data record may be 50,000 points long, while the screen is only capable of displaying 500 points. Therefore, to view the whole acquisition in one display, a 1:100 decimation is required. Conversely, when a user wants a more detailed view of a portion of a waveform and the original data acquisition acquired fewer valid data values in the region of interest than would be required to produce such a display, interpolation (e.g., linear or sin(x)/x) is performed to supply the additional points for that display. The software that performs this function, the I/D (interpolation/decimation) routine, is now well known, having now been part of oscilloscope products for several years.

In more than one oscilloscope on the market today, including the 11000 Series Digitizing Oscilloscopes, the operator is provided with up to three inter-related displays of an acquired waveform, a main trace and two zoomed traces. The two zoomed traces provide magnified displays of highlighted (i.e., intensified) portions of the main trace. Each zoomed trace is an expanded region of the main trace that is displayed in its own window. Each window may be controlled independently to have different horizontal and vertical settings. Having independent settings necessitates having separate graticules or separate scale indications for each trace on a common graticule.

While this independence of the two expansion windows is convenient under some circumstances, it is also extremely inconvenient under other circumstances. For example, in comparing the details of two pulses it is most convenient to overlay them and see where they coincide and where they diverge. However, it is also frequently necessary to change the horizontal (time) and vertical (amplitude) expansion factors to look more closely at the waveforms during the course of the comparison. With independent expansion windows this means replicating the setting adjustments for the two displays and switching control functions between the different zoomed displays in order to accomplish this. Thus, using a prior art dual zoom oscilloscope for some operations is inconveniently complicated and confusing.

SUMMARY OF THE INVENTION

It would therefore be desirable to have an oscilloscope with dual zoomed displays whose horizontal and vertical expansion factors, graticules, and readouts are linked together to act cooperatively. It would also be desirable to be able to see the relationship between the expansion windows and the main trace and also to be able to visualize the vertical expansion factor of the zoomed display and its relationship to the main display.

Accordingly, the present invention is an improved digital oscilloscope of the type that processes the digital waveform values of the waveform record using interpolation and/or decimation to produce a main waveform record and first and second zoomed waveform records, and uses those records to produce a main trace display and first and second zoomed trace displays. The improvement is obtained by providing a first zoom box encompassing that portion of the main trace display shown in the first zoomed trace display and a second zoom box encompassing that portion of the main trace display shown in the second zoomed trace display. Controls for the two zoom boxes are "ganged" together so that they both have a horizontal-time dimension determined by a relationship between horizontal-time settings of the first zoomed trace display and horizontal-time settings of the main trace display and vertical-amplitude dimensions determined by a relationship between vertical-amplitude settings of the first zoomed trace display and vertical-amplitude settings of the main trace display. The horizontal-time separation between the first and second zoomed displays and the two zoom boxes is controllable by an operator and provided as a readout for measurement convenience.

DETAILED DESCRIPTION OF THE INVENTION

Figure 1:
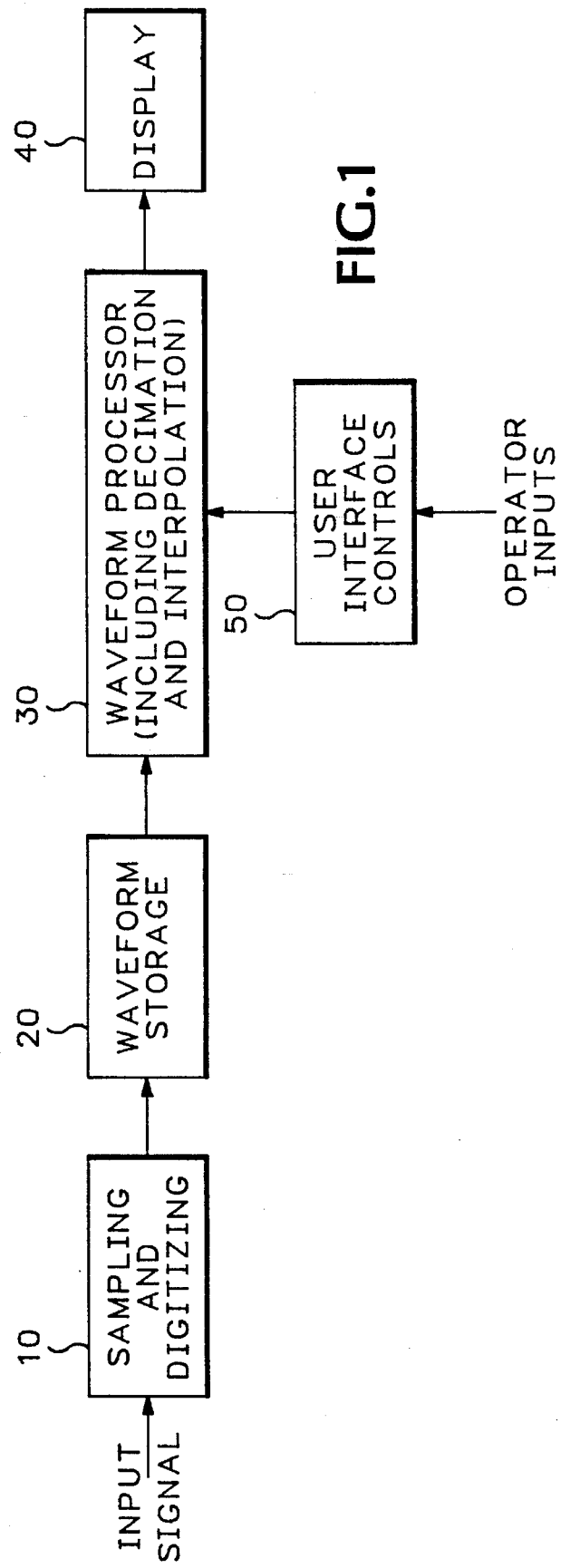
FIG. 1 is a simplified block diagram of the hardware of a digital oscilloscope.

Referring first to FIG. 1, a typical modern digital oscilloscope has at least the following parts: sampling & digitizing circuitry 10, waveform storage 20, a waveform processor 30, a display 40, and user interface controls 50 responsive to operator inputs. The sampling & digitizing circuitry 10 may also include amplifiers and attenuators (not shown) which are also under the control of the user interface controls 50. The input to the sampling & digitizing circuitry 10 is input signal under examination. The output of the sampling & digitizing circuitry 10 is a waveform record consisting of a series of digital waveform values sequentially related in time and describing the amplitude versus time behavior of the input signal. These digital waveform values are stored in waveform storage 20 according to an addressing scheme that relates their location in memory to their position in the waveform record.

The waveform processor 30 is capable of performing both decimation or interpolation in accordance with parameters received from the user interface controls 50. Thus, one waveform record stored in the waveform storage 20 can be shown on the display 40 with various horizontal (time) and vertical (amplitude) settings selected by the operator. The same waveform record can also be used as the basis for more than one display of the acquired waveform on the same screen, i.e., a "zoomed" display or displays can be shown along with the display of the main trace.

Figure 2:
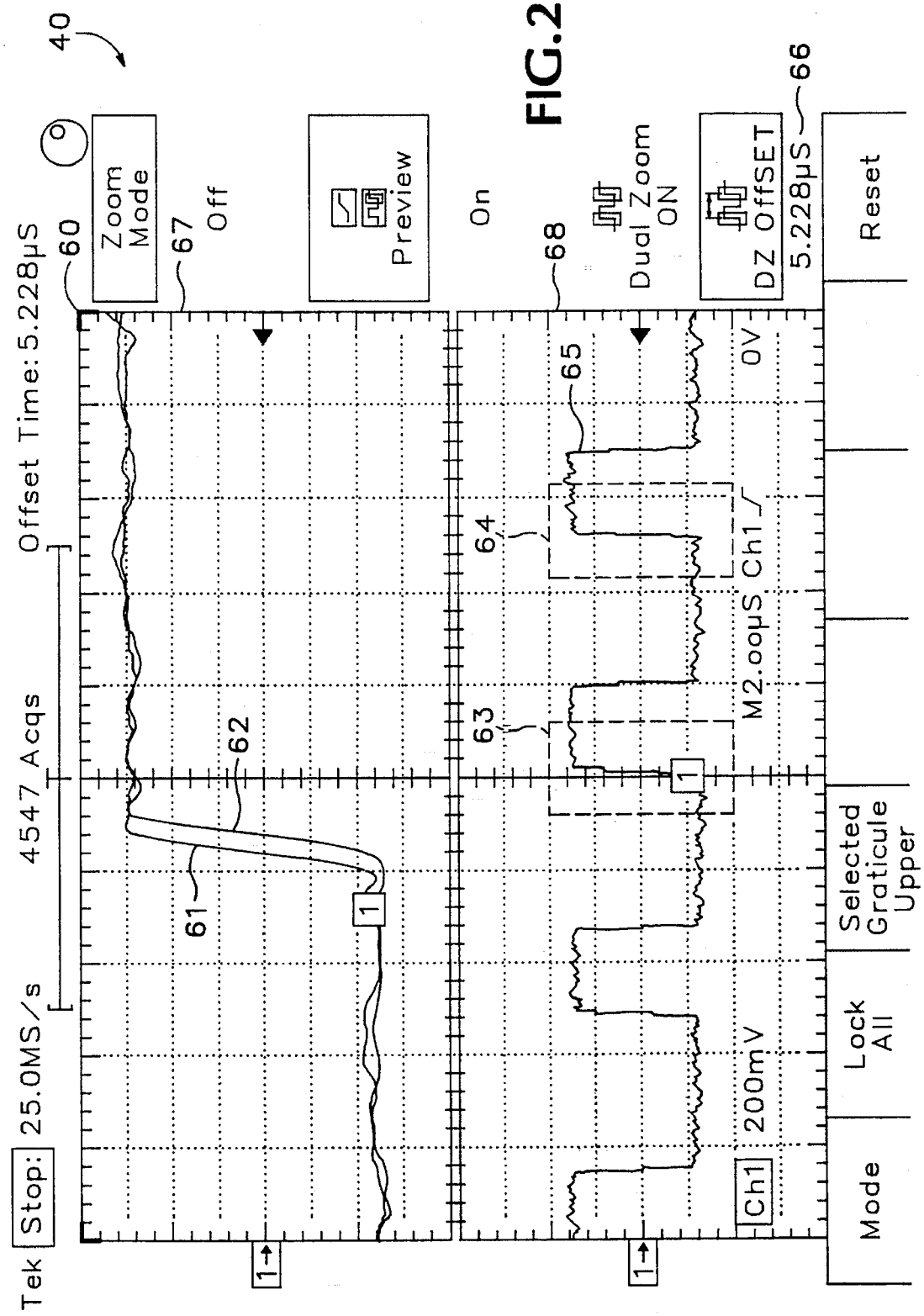
FIG. 2 is a display screen illustration showing the dual zoom boxes and related displays according to the present invention.

Referring next to FIG. 2, the dual zoom boxes 63,64 of the present invention can be seen in the lower graticule 68 of this display 40. The first zoom box 63 is labeled "Zoom Box" and the second one 64 is labeled "DualZoom Box". The two zoomed traces 61,62 shown in the top graticule 67 of the display 40 are expanded or "zoomed" versions of two different parts of the same acquisition waveform that is shown more completely in the main trace 65 in the lower graticule 68 of the display. Note how the two similar rising edges shown within the Zoom Box 63 and DualZoom Box 64 of the lower main trace 65 display are shown almost overlapped in the upper display of the zoomed trace 61 and dualzoomed trace 62.

According to a preferred embodiment of the present invention, the horizontal (time/division) and vertical (volts/division) controls for the DualZoom Box 64 are "ganged" to the controls for the first Zoom Box 63. This makes the operation of the DualZoom Box 64 simple and easy to use, but at the expense of limiting the degrees of freedom available to the operator. Nonetheless, this has been found to be a very desirable tradeoff from the perspective of the average operator. As can be seen from the following table, the total number of operator actions necessary to perform some common tasks is greatly reduced by the use of the present invention. The prior art oscilloscope referred to in this table is an 11000 Series Digitizing Oscilloscopes made by Tektronix, Inc., assignee of the present invention.

COMPARISON OF PROCEDURES
ILLUSTRATING THE BENEFITS OF THE INVENTION

| PRIOR ART OSCILLOSCOPE | PRESENT INVENTION OSCILLOSCOPE |
| --- | --- |
| Initial setup and time difference measurement (assuming main channel already acquired) | |
| press [WINDOW] icon | press zoom button |
| adjust alt-window1 horizontal size | switch to Zoom Preview |
| adjust alt-window1 horizontal position | adjust horizontal position |
| press [vertical arrow]icon (assigns knobs) | adjust horizontal scale |
| adjust alt-window1 vertical position | adjust vertical position |
| press main window | adjust vertical scale |
| press [WINDOW2] icon | switch DualZoom ON |
| adjust alt-window2 horizontal position | adjust offset time |
| press [vertical arrow] icon (assigns knobs) | read offset time |
| adjust alt-window2 vertical position | |
| press [CURSORS] icon | |
| press [CURSOR TYPE] (in bottom menu) | |
| press [SPLIT DOTS] (in popup menu) | |
| press [WFW3/window2] | |
| adjust cursor1 | |
| adjust cursor2 | |
| readout delta-time | |

COMPARISON OF PROCEDURES
ILLUSTRATING THE BENEFITS OF THE INVENTION

| PRIOR ART OSCILLOSCOPE | PRESENT INVENTION OSCILLOSCOPE |
|---|---|
| Adjust vertical scale/position to see pulse tops | |
| press lower window | adjust vertical scale |
| press [PAGE TO PREVIOUS MENU] | adjust vertical position |
| press [VERTICAL DESC] | |
| press [+][0][ENTER DESC] | |
| press lower window | |
| press [VERTICAL DESC] | |
| press [+][0][ENTER DESC] | |
| press [vertical arrow] icon | |
| adjust vertical magnitude | |
| adjust vertical position | |
| press lower window | |
| press [vertical arrow] icon | |
| adjust vertical magnitude | |
| adjust vertical position | |
| Reposition Zoomed traces vertically | |
| adjust vertical position | adjust vertical position |
| press lower window | |
| adjust vertical position | |

In a preferred embodiment, the DualZoom Box 64 is restricted to being the same size as the Zoom Box 63 and also restricted to having the same vertical position. The DualZoom Box 64 is also constrained in this embodiment so that it can only appear to the right of the Zoom Box 63, and may not overlap it or appear to its left.

Figure 3:
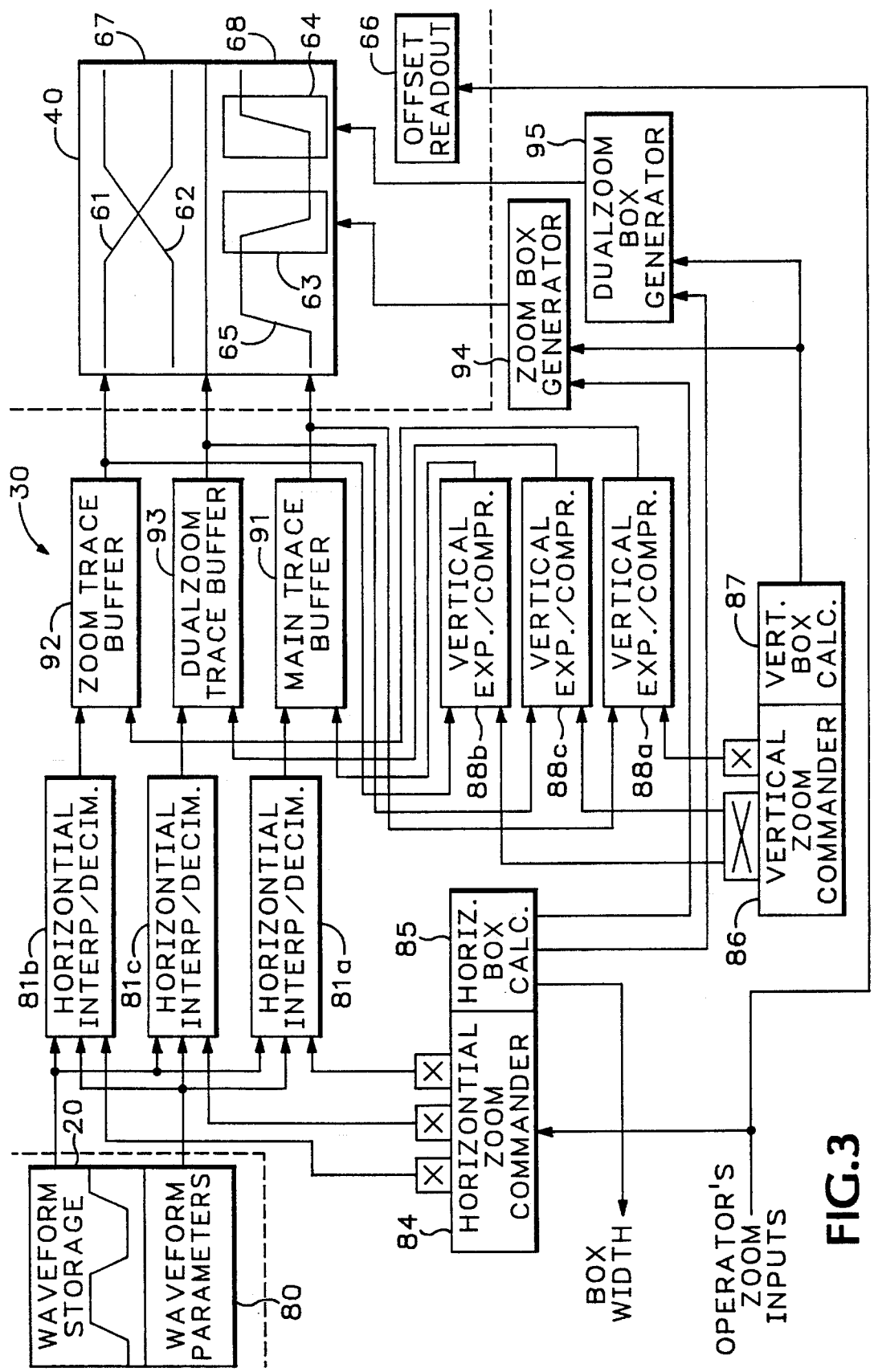
FIG. 3 is a conceptual block diagram illustrating the implementation of the present invention in software.

Referring now to FIG. 3, a conceptual block diagram illustrating the implementation of the present invention in software, the waveform storage 20 of FIG. 1 is shown here again, but there is here shown associated with it storage for a set of waveform parameters 80 associated with the waveform data stored in the waveform storage. The operator's zoom inputs are conveyed to horizontal zoom commander 84 and vertical zoom commander 86. The operator inputs that control the main trace acquisition will also have an effect on the content of the waveform parameters 80, in that each acquired waveform in the waveform storage 20 has associated with it a set of waveform parameters 80 describing its properties. Of these properties, the ones of particular interest in connection with the present discussion are the waveform's record length, the number of samples in the record, and the time per division setting at which it was acquired.

The horizontal zoom commander 84 maintains values, indexed one per waveform, for the zoom magnification factor, the main trace 65 (horizontal) position, the zoomed trace 61 (horizontal) position, and the dualzoom offset time. The horizontal zoom commander 84 supplies these values to a horizontal interpolation/decimation routine 81*a,b,c* in three different instances, once 81*a* for the main trace 65, once again 81*b* for the zoomed trace 61, and finally 81*c* for the dualzoom trace 62. While there is only one such horizontal interpolation/decimation routine, it is shown three times because it operates on the data three different times, one for each of the main trace 65, the zoomed trace 61, and dualzoom trace 62.

The three "X"s shown at the top of the horizontal zoom commander 84 indicate that three sets of independent horizontal information are supplied to the horizontal interpolation/decimation routine 81*a*,81*b*,81*c*, use in connection with the main trace 65, the zoomed trace 61, and the dualzoom trace 62, respectively. In contrast, note the "X" having a double width at the top of the vertical zoom commander 86. This signifies that the vertical controls on the zoomed trace 61 and dualzoom trace 62 are "ganged" together.

The horizontal interpolation/decimation routine 81*a*,81*b*, 81*c* uses the zoom magnification factor, the main trace position, the zoomed trace position and the dualzoom offset time, along with the record length from the waveform parameters 80, to select a beginning point of the waveform data stored in the waveform storage 20 and a beginning point in the buffers 91,92,93 containing the output versions of the main trace 65, the zoomed trace 61, and the dualzoom 62 trace, respectively. Using these points as its starting points for input and output, the horizontal interpolation/decimation routine 81*a*,81*b*,81*c* can then expand or compress the waveform data samples in accordance with the zoom magnification factor to produce the zoomed trace 61 and dualzoom trace 62. The main trace 65 is calculated with a nominal zoom magnification factor of 1.0 or some value less than 1.0 if a "Fit-To-Screen" feature is enabled. The outputs of these operations are stored in the main trace buffer 91, the zoom trace buffer 92, and the dualzoom trace buffer 93.

The horizontal box calculator 85 computes the horizontal position of zoom box 63, the offset between the horizontal position of the zoom box 63 and the dualzoom box 64, and the width of both boxes (which is the same), and supplies this information to the zoom box generator 94 and dualzoom box generator 95. The operator selected offset time between the zoomed displays is sent to offset readout 66 after it has been limited by system-imposed minimum and maximum values. In a preferred embodiment, the minimum allowable offset is the width of one of the zoom boxes 63 or 64, since the boxes are not allowed to overlap. The maximum allowable offset is the duration of the stored main waveform 20 plus the duration of a zoomed trace 61 or 62 at the current zoom settings. When user selected values fall outside of the minimum and maximum values that the offset may have, that value is saved as a "requested" value and used as an input to the limiting process when changes in other user selected values alter the available minimum and maximum values.

The horizontal position of the dualzoom trace 62 is calculated as the position of the zoom trace 61 plus the fraction of the main trace waveform represented by the dualzoom offset time over the duration of the main trace.

For example, consider a main trace 65 centered so that the center of its graticule 68 is positioned within the waveform record so that 50% of the points in the waveform record are to the left of that center of the graticule. Now also assume that a zoomed trace 61 is positioned so that the center of its graticule 67 has 25% of the points in the waveform record are to the left of that center. Further assume that the zoomed trace is a 10× magnification of the main trace and that the dualzoom offset is 750 μsec. Finally, assume that the main trace 65 is composed of 500 points, is 10 divisions long, and each division represents 500 μsec/division. Under these circumstances, the dual zoom position is calculated as follows:

$$\begin{aligned}\text{dualzoom position} &= \text{zoom position} + \\ &\quad (\text{offset time/duration of main trace}) \\ &= 0.25 + (750\ \mu\text{sec}/(500\ \mu\text{sec/div})*10\text{div}) \\ &= 0.25 + (750\ \mu\text{sec}/5000\ \mu\text{sec}) \\ &= 0.25 + 0.15 \\ &= 0.40\end{aligned}$$

Note that in these calculations, the position of the main trace does not enter into the equation. Also, notice that the 10× magnification factor only plays a part in determining the minimum allowable dualzoom offset time, which is equal to the box width and 500 μsec here. The minimum allowable offset is the same as the width of one zoom box, since the zoom box 63 and dualzoom box 64 are not allowed to overlap and their centers are therefore separated by one half of the widths of both of them and both of their widths are equal.

Now shifting the focus of this discussion to the vertical, the vertical zoom commander 86 receives operator information regarding the selected vertical zoom factor, the graticule scaling, and information pertaining to the positioning resulting from switching from a single graticule display at full height to the half-height dual graticule display required for zooming. (In zoom mode, all traces are calculated with a nominal 0.5× magnification factor in addition to the operator requested zoom factor in order to account for the half-height graticules.)

The vertical zoom commander 86 supplies the zoom factor and the position and graticule scaling values to a vertical expansion/compression routine 88a,88b,88c. While there is only one such vertical expansion/compression routine, it is shown three times because it operates on the data three different times, one for each of the main trace 65, the zoomed trace 61, and dualzoom trace 62. The vertical expansion/compression routine 88a,88b,88c manipulates the trace data in the three trace buffers 91, 92, and 93 after their contents have been manipulated by the horizontal interpolation/decimation routines 81a,81b,81c and returns the results of its operations back to these buffers.

The zoomed 61 and dualzoom 62 traces are positioned as shown in the following example. For this example, the main trace is positioned at −1.0, the zoomed trace and dualzoomed trace are positioned at 1.75, the vertical zoom factor is 1.0 (2.0*0.5, no zoom), and the number of pixel points per full division on the screen is 50:

$$\begin{aligned}\text{zoom box position} &= \text{graticule center} - ((\text{main trace pos.} + \\ &\quad \text{zoomed pos.}) * \text{zoom mag.} * 50\ \text{pt/div}) \\ &= 0 - ((-1.0\ \text{div} + \\ &\quad 1.75\ \text{div}) * 1.0 * 50\ \text{pts/div}) \\ &= 37.5\ \text{pts., or about 1.5 half-height divisions}\end{aligned}$$

The horizontal zoom box calculator 85 and vertical zoom box calculator 87 each perform their part of the calculations necessary to draw zoom box 63 and dualzoom box 64, and supply the results of their calculations to the zoom box generator 94 and dualzoom box generator 95. The width and height of each box is calculated to be the inverse of the ratio between the magnification for the zoomed trace display 67 and the magnification for the main trace display 68. The vertical zoom box calculator 87 supplies the same height information to both the zoom box generator 94 and the dualzoom box generator 95, since they both "ganged" together to have the same vertical controls in a preferred embodiment of the invention.

In the following example of a zoom box height calculation, the vertical magnification factor for the zoomed traces is 5× and the overall vertical magnification factor for the dual graticule is 0.5×:

$$\begin{aligned}\text{zoom box height} &= (\text{main mag. factor/zoomed mag. factor}) * \\ &\quad \text{graticule height} \\ &= (0.5/(0.5*5.0)) * 200\ \text{pts.} \\ &= 40\ \text{pts. (which is 40/25 of a division, or} \\ &\quad 1.6\ \text{divisions)}\end{aligned}$$

In the following example of a zoom box 63 width calculation, the horizontal magnification factor for the zoomed traces is 5× and the main trace horizontal magnification factor is assumed to be 0.1× (as the result of a Fit-To-Screen processing of a 5000 point acquisition into a 500 point display):

$$\begin{aligned}\text{zoom box width} &= (\text{main mag. factor/zoomed mag. factor}) * \\ &\quad \text{graticule width} \\ &= (0.1/5.0)) * 500\ \text{pts.} \\ &= 10\ \text{pts. (which is 10/50 of a division, or} \\ &\quad 0.2\ \text{divisions)}\end{aligned}$$

The vertical position of the zoom boxes 63,64 is dependent on the zoom vertical position and the graticule constants. A zoom box 63 position is calculated directly into a screen line value, with screen line 0 being at the top of the display and screen line 479 being at the bottom. As the vertical position of the zoomed 61 and dualzoom 62 traces display 67 is moved upward, the zoom boxes 63,64 themselves move down within the lower display 68. In the following example, the zoomed trace position is 1.75 divisions up within the upper display 67, the number of lines in the lower graticule 68 is 200, the number of divisions in the lower graticule is 8, and line number of the centerline of the lower graticule is 334:

zoomed box vertical position = zoomed trace position *
(lower graticule #ofLines/
ofDivisions) + lower
graticule centerline#
= 1.75 * (200/8) + 334
= 1.75 * 25 + 334
= 44 + 334 = 378

The calculated zoomed box 63 and dualzoom 64 box positions refer to the center of the zoom box, which leads to the easiest way to handle widths and heights as relative to that center position.

The horizontal position of a zoom box 63 is calculated as shown in the following example, in which the main trace 65 is assumed to have a position of 60% (0.60), the zoomed trace 61 is assumed to have position of 48% (0.48), and the acquired waveform record has 1000 points. In this example, the Fit-To-Screen function is assumed to be off, so that the 1000 points of the waveform record corresponds to 20 divisions of main trace length, even though only 10 at a time may be seen on the screen. One further fact necessary to understand the following example is that there is a 24 point band on the screen to the left of the graticule, so that the left-to-right center of the 500 point graticule is at point 274, not point 250 as would otherwise be the case. The position of the main zoom box 63 is then calculated as follows:

zoom box position = ((zoom trace position – main trace
position) * main trace length in
divisions * horizontal points per
division) + graticule horizontal
center point
= (0.48 – 0.60) * 20 divs * (50 pts/
div) + (24 + (500/2)) pts
= (–0.12 * 1000) pts + 274 pts
= –120 pts + 274 pts
= 154 pts (120 points or 1.4 divisions
to the left of center)

The calculation of the dualzoom box 64 position is shown in the following example, in which the offset between the zoom box 63 and dualzoom box 64 is 3.8 ms:

dualzoom box position = main zoom box position +
(offset time/main trace time per
division) * 50 pts/div
= 154 pts + ((3.8ms/(500 μsec/div)) *
50 pts/div)
= 154 pts + (7.6 div * 50 pts/div)
= 154 pts + 380 pts
= 534 pts (or 0.2 divisions beyond the
right side of the graticule)

This example illustrates the fact that, in the preferred embodiment, the zoom boxes may extend beyond the edge of the graticule. Such boxes are still in the waveform record, which may extend well beyond the part that is visible in the main trace in either direction. In this example, even though the center of the dualzoom box 64 is off the right side of the screen, the left side of that dualzoom box and part of its top and bottom are still visible in the display.

The results of the calculations from the horizontal zoom box calculator 85 and the vertical zoom box calculator are passed to the zoom box generator 94 and the dualzoom box generator 95. Except for storing different horizontal location information, the zoom box generator 94 and dualzoom box generator 95 are really the same routine operating on the same data.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

I claim:

1. An improved digital oscilloscope of the type having means for sampling and digitizing (10) an electrical input signal over time to produce a waveform record consisting of a series of digital waveform values sequentially related in time, means for storing (20) the waveform record so that the memory address of each digital waveform value is indicative of a relative time at which that value was sampled, means for processing (30) the digital waveform values of the waveform record using interpolation and/or decimation (81) to produce a main trace record (91) and first (92) and second (93) zoomed trace records, means for producing (40) a main trace display (65) and first (61) and second (62) zoomed trace displays from the main trace record and the first and second zoomed trace records respectively, wherein the improvement comprises:

means for providing (94) a first zoom box (63) encompassing that portion of the main trace (65) display shown in the first zoomed trace (61) display, the first zoom box having a horizontal-time dimension determined (85) by a relationship between horizontal-time settings of the first zoomed trace display and horizontal-time settings of the main trace display and a vertical-amplitude dimension determined (87) by a relationship between vertical-amplitude settings of the first zoomed trace display and vertical-amplitude settings of the main trace display; and means for providing (95) a second zoom box (64) encompassing that portion of the main trace (65) display shown in the second zoomed trace (62) display, the second zoom box having a horizontal-time dimension determined (85) by a relationship between horizontal-time settings of the second zoomed trace display and horizontal-time settings of the main trace display and a vertical-amplitude dimension determined (87) by a relationship between vertical-amplitude settings of the second zoomed trace display and vertical-amplitude settings of the main trace display.

2. An improved digital oscilloscope according to claim 1 wherein the horizontal-time and vertical-amplitude settings of the first and second zoomed trace displays are ganged together and controlled by common controls (50).

3. An improved digital oscilloscope according to claim 2 wherein the first and second zoomed trace displays share a common graticule and readout of their settings (67).

4. An improved digital oscilloscope according to claim 1 further comprising means for controlling (50) and displaying (66) a horizontal-time difference along the main trace (65) between a reference point associated with the first zoom box (63) and a reference point associated with the second zoom box (64).

5. An improved digital oscilloscope according to claim 2 further comprising means for controlling (50) and displaying (66) a horizontal-time difference along the main trace (65) between a reference point associated with the first zoom box

(63) and a reference point associated with the second zoom box (64).

6. An improved digital oscilloscope according to claim 3 further comprising means for controlling (50) and displaying (66) a horizontal-time difference along the main trace (65) between a reference point associated with the first zoom box (63) and a reference point associated with the second zoom box (64).

\* \* \* \* \*